(12) United States Patent
Cui et al.

(10) Patent No.: US 9,530,600 B2
(45) Date of Patent: Dec. 27, 2016

(54) MICROELECTRONIC SWITCH AND ACTIVE MATRIX ORGANIC LIGHT EMITTING DISPLAY DEVICE

(71) Applicants:BOE TECHNOLOGY GROUP CO., LTD., Beijing (CN); BEIJING BOE OPTOELECTRONICS TECHNOLOGY CO., LTD., Beijing (CN)

(72) Inventors: Ziwei Cui, Beijing (CN); Hao Wu, Beijing (CN); Hong Zhu, Beijing (CN); Hongjun Yu, Beijing (CN); Hailin Xue, Beijing (CN); Luyang Wang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 35 days.

(21) Appl. No.: 14/801,213

(22) Filed: Jul. 16, 2015

(65) Prior Publication Data
US 2016/0155594 A1    Jun. 2, 2016

(30) Foreign Application Priority Data
Nov. 28, 2014    (CN) .......................... 2014 1 0715663

(51) Int. Cl.
    *H01H 59/00*    (2006.01)
    *H01L 27/32*    (2006.01)
    *H01H 1/00*    (2006.01)
(52) U.S. Cl.
    CPC ...... *H01H 59/0009* (2013.01); *H01L 27/3262* (2013.01); *H01H 2001/0084* (2013.01)

(58) Field of Classification Search
    CPC ..... H01H 59/0009; H01H 3/54; H01H 3/0213
    See application file for complete search history.

(56) References Cited

U.S. PATENT DOCUMENTS 5,258,591 A * 11/1993 Buck .................. H01H 59/0009
                                                    200/181
5,367,136 A * 11/1994 Buck .................. H03K 17/975
                                                    200/181
(Continued)

FOREIGN PATENT DOCUMENTS

CN           1624846         6/2005

OTHER PUBLICATIONS

Lee, Jeong "A New Method of Driving an AMOLED with MEMS Switches" MEMS 2008, pp. 132-135 Jan. 17, 2008.*
(Continued)

*Primary Examiner* — Matthew Landau
*Assistant Examiner* — Grant Withers
(74) *Attorney, Agent, or Firm* — Blakely Sokoloff Taylor & Zafman LLP

(57) ABSTRACT

The embodiments of the present invention discloses a microelectronic switch comprising: a gate electrode; a source electrode; a drain electrode; a first electrostatic electrode; a cantilever with two working positions of an open position and a close position; a connecting portion arranged at the cantilever; a second electrostatic electrode arranged at the cantilever, the second electrostatic electrode is electrically connected with the gate electrode and is arranged opposite to the first electrostatic electrode; an insulating dielectric layer arranged between the first electrostatic electrode and the second electrostatic electrode; the cantilever is located at one working position of the two working positions when the voltage applied by the gate electrode to the second electrostatic electrode is less than a preset threshold, the cantilever is switched to the other working position of the two working (Continued)

positions when said voltage is greater than the preset threshold.

20 Claims, 1 Drawing Sheet

(56) References Cited

U.S. PATENT DOCUMENTS

| | | | | |
|---|---|---|---|---|
| 6,153,839 | A * | 11/2000 | Zavracky | H01H 59/0009 200/181 |
| 6,509,605 | B1 * | 1/2003 | Smith | G11C 23/00 257/316 |
| 6,534,839 | B1 * | 3/2003 | Frazier | B82Y 10/00 200/181 |
| 6,624,367 | B1 * | 9/2003 | Chen | H01H 59/0009 200/181 |
| 2003/0222321 | A1 * | 12/2003 | Yang | H01H 59/0009 257/415 |
| 2004/0022044 | A1 * | 2/2004 | Yasuoka | H01H 59/0009 361/801 |
| 2004/0140872 | A1 * | 7/2004 | Wong | H01H 59/0009 335/78 |
| 2005/0285697 | A1 * | 12/2005 | Chou | H01H 59/0009 333/105 |
| 2006/0232365 | A1 * | 10/2006 | Majumder | H01H 59/0009 335/78 |
| 2007/0290773 | A1 * | 12/2007 | Bar | H01H 59/0009 333/262 |
| 2008/0042518 | A1 * | 2/2008 | Liu | H01H 59/0009 310/319 |
| 2008/0043523 | A1 * | 2/2008 | Liu | H01H 9/167 365/164 |
| 2011/0094861 | A1 * | 4/2011 | Feng | H01H 1/0094 200/181 |
| 2012/0156820 | A1 * | 6/2012 | Kim | H01H 1/0036 438/50 |
| 2012/0175715 | A1 * | 7/2012 | Hammond | H01H 1/0036 257/415 |
| 2012/0318648 | A1 * | 12/2012 | Hall | H01H 11/00 200/181 |
| 2016/0257558 | A1 * | 9/2016 | Aimi | B81B 3/0059 |

OTHER PUBLICATIONS

Yoon, Jun-Bo "3.4: Invited Paper: A Novel Use of MEMS Switches in Driving AMOLED" SID Symp. Dig. of Tech Papers vol. 1, Iss. 1 pp. 13-16 May 2008.*

Saad, Said "High Efficiency Driver for AMOLED with Compensation" Advances in Electronics vol. 2015 Iss. 2015 pp. 1-5 Feb. 2015.*

Chinese Office Action with English Language Translation, dated Jan. 29, 2016, Chinese Application No. 201410715663.1.

* cited by examiner

MICROELECTRONIC SWITCH AND ACTIVE MATRIX ORGANIC LIGHT EMITTING DISPLAY DEVICE

FIELD OF THE INVENTION

The present invention relates to the field of display technology, particularly to a microelectronic switch and an active matrix organic light emitting display device.

BACKGROUND OF THE INVENTION

In the field of display technology, the luminance of each pixel in an active matrix organic light emitting display device (AMOLED) is in direct proportion to the driving current passing through it.

In the prior art, the switch device for controlling on and off of the driving current in each pixel in the active matrix organic light emitting display device is a thin film transistor (TFT) switch, and the active layer in the TFT mostly adopts a-Si active layer or p-Si active layer.

However, the TFT adopting the a-Si active layer has the problem of threshold voltage shift in working, while the TFT adopting the p-Si active layer has a relatively bad uniformity of the threshold voltage of the TFT due to the grain boundary problem in the p-Si active layer.

Therefore, in the prior art, the switch device used in the active matrix organic light emitting display device has a relatively bad uniformity of the threshold voltage in working, the active matrix organic light emitting display device (AMOLED) needs to use a more complex pixel driving circuit to solve the problem of non-uniformity of its luminous intensity, thereby resulting in a relatively complex design of the pixel driving circuit in the active matrix organic light emitting display device.

SUMMARY OF THE INVENTION

The present invention provides a microelectronic switch and an active matrix organic light emitting display device, the threshold voltage of the microelectronic switch has good uniformity in working, it is unnecessary to arrange in the active matrix organic light emitting display device a complex circuit for improving uniformity of the threshold voltage, thereby being benefit for simplifying the pixel driving circuit in the active matrix organic light emitting display device.

In order to achieve the above object, according to one aspect of the present invention, the following technical solution is provided:

A microelectronic switch, comprising:
a gate electrode;
a source electrode;
a drain electrode;
a first electrostatic electrode electrically connected with a common electrode line;
a cantilever with two working positions of an open position and a close position;
a connecting portion arranged at a side of the cantilever facing towards the source electrode and the drain electrode, when the cantilever is in the close position, the connecting portion being electrically connected with the source electrode and the drain electrode;
a second electrostatic electrode arranged on a surface of a side of the cantilever facing towards the first electrostatic electrode, the second electrostatic electrode being electrically connected with the gate electrode and arranged opposite to the first electrostatic electrode;
an insulating dielectric layer arranged between the first electrostatic electrode and the second electrostatic electrode,
wherein the cantilever is located at one working position of the two working positions when the voltage applied by the gate electrode to the second electrostatic electrode is less than a preset threshold, the first electrostatic electrode and the second electrostatic electrode attract each other so as to enable the cantilever to be switched to the other working position of the two working positions when the voltage applied by the gate electrode to the second electrostatic electrode is greater than the preset threshold.

The above microelectronic switch controls whether the first electrostatic electrode and the second electrostatic electrode attract each other by controlling whether the gate electrode provides a voltage greater than a preset threshold for the second electrostatic electrode in the process of use, thereby controlling the working position of the cantilever, and finally controlling whether the connecting portion connects the source electrode and the drain electrode.

In the above microelectronic switch, the components for controlling on and off between the source electrode and the drain electrode are micromechanical structures such as the cantilever, the connecting portion, the first electrostatic electrode, the second electrostatic electrode, the gate electrode etc., the threshold voltage shift, grain boundary and the like do not exist, the threshold voltage has a good uniformity when it connects the source electrode and the drain electrode, so that it is unnecessary to arrange in the active matrix organic light emitting display device a complex circuit for improving uniformity of the threshold voltage, thereby being benefit for simplifying the pixel driving circuit in the active matrix organic light emitting display device.

Further, the cantilever is a cantilever made of silicon nitride.

Further, the second electrostatic electrode is electrically connected with the gate electrode through a metal beam.

Further, the metal beam is made of Au with a Young's modulus of 78 GPa and a Poisson's ratio of 0.44.

Further, the second electrostatic electrode has a plurality of through holes extending along a direction in which the second electrostatic electrode faces towards the first electrostatic electrode.

Further, the size of the second electrostatic electrode is smaller than the size of the connecting portion along a direction perpendicular to the direction in which the second electrostatic electrode faces towards the first electrostatic electrode and perpendicular to the extending direction of the metal beam.

Further, the insulating dielectric layer is arranged on a surface of the first electrostatic electrode facing towards the second electrostatic electrode.

Further, the insulating dielectric layer is made of $Si_3N_4$ with a dielectric constant of 7.5.

Further, along the extending direction of the cantilever, the gate electrode is located between the first electrostatic electrode and the source electrode and drain electrode, and the gate electrode, the first electrostatic electrode, the source electrode and drain electrode are located at the same side of the cantilever; when the voltage applied by the gate electrode to the second electrostatic electrode is less than a preset threshold, the cantilever is in the close position, the connecting portion is electrically connected with the source electrode and the drain electrode; when the voltage applied by the gate electrode to the second electrostatic electrode is greater than the preset threshold, the first electrostatic electrode and the second electrostatic electrode attract each other, the cantilever is in the open position.

Further, along the extending direction of the cantilever, the first electrostatic electrode is located between the gate electrode and the source electrode and drain electrode, and the gate electrode, the first electrostatic electrode, the source electrode and the drain electrode are located at the same side of the cantilever; when the voltage applied by the gate electrode to the second electrostatic electrode is less than a preset threshold, the cantilever is in the open position; when the voltage applied by the gate electrode to the second electrostatic electrode is greater than the preset threshold, the first electrostatic electrode and the second electrostatic electrode attract each other, the cantilever is in the close position, the connecting portion is electrically connected with the source electrode and the drain electrode.

According to another aspect of the present invention, an active matrix organic light emitting display device is further provided. The active matrix organic light emitting display device comprises a microelectronic switch provided in any of the above technical solutions.

DETAILED DESCRIPTION OF THE INVENTION

Next, the technical solutions in the embodiments of the present invention will be described clearly and completely in combination with the drawings in the embodiments of the present invention, apparently, the embodiments described are only a part, rather than all of the embodiments of the present invention. Other embodiments obtained by the ordinary skilled person in the art based on the embodiments in the present invention without paying any creative work all belong to the protection scope of the present invention.

Figure 1:
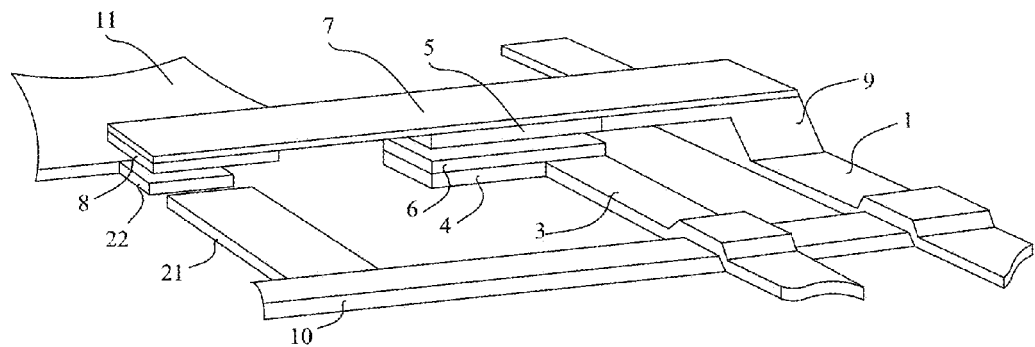
FIG. 1 is a structural schematic view of a microelectronic switch provided by an embodiment of the present invention.

Please refer to FIG. 1, FIG. 1 is a structural schematic view of a microelectronic switch provided by an embodiment of the present invention.

As shown in FIG. 1, the microelectronic switch provided by the embodiment of the present invention comprises:

a gate electrode 1;

a source electrode 21;

a drain electrode 22;

a first electrostatic electrode 4 electrically connected with a common electrode line 3;

a cantilever 7 with two working positions of an open position and a close position;

a connecting portion 8 arranged at a side of the cantilever 7 facing towards the source electrode 21 and the drain electrode 22, when the cantilever 7 is in the close position, the connecting portion 8 being electrically connected with the source electrode 21 and the drain electrode 22;

a second electrostatic electrode 5 arranged on a surface of a side of the cantilever 7 facing towards the first electrostatic electrode 4, the second electrostatic electrode 5 being electrically connected with the gate electrode 1 and arranged opposite to the first electrostatic electrode 4;

an insulating dielectric layer 6 arranged between the first electrostatic electrode 4 and the second electrostatic electrode 5, wherein the cantilever 7 is located at one working position of the two working positions when the voltage applied by the gate electrode 1 to the second electrostatic electrode 5 is less than a preset threshold, the first electrostatic electrode 4 and the second electrostatic electrode 5 attract each other so as to enable the cantilever 7 to be switched to the other working position of the two working positions when the voltage applied by the gate electrode 1 to the second electrostatic electrode 5 is greater than the preset threshold.

For example, in the structure as shown in FIG. 1, when the voltage applied by the gate electrode 1 to the second electrostatic electrode 5 is less than a preset threshold, the cantilever 7 is at the open position, here, the connecting portion 8 does not contact with the source electrode 21 and the drain electrode 22, the source electrode 21 and the drain electrode 22 are disconnected, such that the signal in the data line 10 cannot be transferred to an electrode 11 in the pixel of the active matrix organic light emitting device.

In the process of use of the above microelectronic switch, when the voltage applied by the gate electrode 1 to the second electrostatic electrode 5 is greater than the preset threshold, a voltage difference is generated between the second electrostatic electrode 5 and the first electrostatic electrode 4, the first electrostatic electrode 4 and the second electrostatic electrode 5 attract each other under the effect of electrostatic force, thereby enabling the cantilever 7 to remain at one working position of the two working positions. When the gate electrode 1 withdraws the voltage applied to the second electrostatic electrode 5 or when the voltage applied by the gate electrode 1 to the second electrostatic electrode 5 is less than the preset threshold, the electrostatic force between the first electrostatic electrode 4 and the second electrostatic electrode 5 disappears, the cantilever 7 is reset to the other working position of the two working positions under the effect of counterbalance, thereby enabling the microelectronic switch to accomplish an action cycle.

The above microelectronic switch controls whether the first electrostatic electrode 4 and the second electrostatic electrode 5 attract each other by controlling whether the gate electrode 1 provides a voltage greater than a preset threshold for the second electrostatic electrode 5, thereby controlling the working position of the cantilever 7, and finally controlling whether the connecting portion 8 connects the source electrode 21 and the drain electrode 22.

In the above microelectronic switch, the components for controlling on and off between the source electrode 21 and the drain electrode 22 are micromechanical structures such as the cantilever 7, the connecting portion 8, the first electrostatic electrode 4, the second electrostatic electrode 5, the gate electrode 1 etc., the threshold voltage shift, grain boundary and the like do not exist, thereby enabling the threshold voltage to have a good uniformity when connecting the source electrode 21 and the drain electrode 22, so that it is unnecessary to arrange in the active matrix organic light emitting display device a complex circuit for improving uniformity of the threshold voltage, thereby being benefit for simplifying the pixel driving circuit in the active matrix organic light emitting display device.

In addition, since the physical motion of the connecting portion 8 in the above microelectronic switch is realized by the electrostatic force between the first electrostatic electrode 4 and the second electrostatic electrode 5, the amplitude of the driving voltage thereof depends on material parameters of the corresponding components in the microelectronic switch, the size of the microelectronic switch and the combination structure of the microelectronic switch etc.

Figure 3:
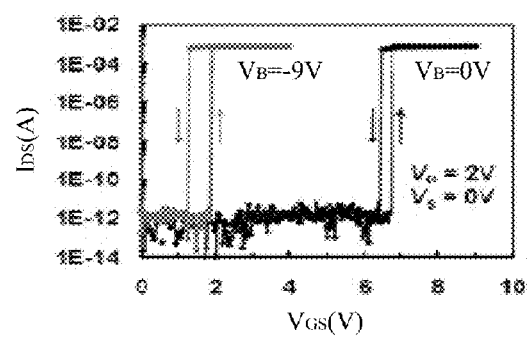
FIG. 3 is a schematic view of a corresponding relationship between a driving voltage and a data line current of a microelectronic switch provided by the embodiment of the present invention in working.

As shown in FIG. 3, $V_D$ is the potential of the drain electrode, $V_S$ is the potential of the source electrode, $V_B=V_D-V_S$, $I_{DS}$ is the current inputted by the data line, $V_{GS}$ is the driving voltage of the above microelectronic switch. Under appropriate material and parameter, the driving voltage of the microelectronic switch may be about 5V, the driving voltage is relatively small compared with about 12V required by the thin film transistor (TFT) switch; the IC chip of the microelectronic switch can be driven by using CMOS level, thereby being capable of removing the IC DC-DC circuit used in the pixel driving circuit, reducing the power consumption effectively, and improving endurance ability of the active matrix organic light emitting display device.

Meanwhile, the above microelectronic switch has incomparable advantages in the aspects of isolation degree, insertion loss, power consumption and linearity degree relative to the FET, TFT full solid state switch.

In the microelectronic switch provided by an embodiment according to an present invention, the cantilever 7 is made of silicon nitride.

As shown in FIG. 1, the second electrostatic electrode 5 is electrically connected with the gate electrode 1 through a metal beam 9 formed on the gate electrode 1.

Further, in order to enable the metal beam 9 to have an excellent Young's modulus and yield strength, so as to ensure high stability of operation of the microelectronic switch and enable the microelectronic switch to have a relatively long life time, the metal beam 9 is made of Au with a Young's modulus of 78 GPa and a Poisson's ratio of 0.44.

According to another embodiment of the present invention, in order to reduce parasitic capacitance formed between the first electrostatic electrode 4 and the second electrostatic electrode 5, the second electrostatic electrode 5 has a plurality of through holes extending along a direction in which the second electrostatic electrode 5 faces towards the first electrostatic electrode 4. The plurality of through holes on the second electrostatic electrode 5 can reduce the overlapping area between the second electrostatic electrode 5 and the first electrostatic electrode 4, thereby being capable of reducing the parasitic capacitance formed between the first electrostatic electrode 4 and the second electrostatic electrode 5.

Indeed, the above microelectronic switch may also reduce the parasitic capacitance formed between the first electrostatic electrode 4 and the second electrostatic electrode 5 through the following ways, such as:

The size of the second electrostatic electrode 5 is smaller than the size of the connecting portion 8 along a direction perpendicular to the direction in which the second electrostatic electrode 5 faces towards the first electrostatic electrode 4 and perpendicular to the extending direction of the metal beam 9. That is, in the whole microelectronic switch, the size at the second electrostatic electrode 5 is narrowed, thereby being capable of making the parasitic capacitance formed between the first electrostatic electrode 4 and the second electrostatic electrode 5 to be relatively small while ensuring connection stability between the connecting portion 8 and the source electrode 21 and drain electrode 22.

According to another embodiment of the present invention, as shown in FIG. 1, the insulating dielectric layer 6 is arranged on a surface of the first electrostatic electrode 4 facing towards the second electrostatic electrode 5.

Further, the insulating dielectric layer 6 is made of $Si_3N_4$ with a dielectric constant of 7.5. The insulating dielectric layer made of $Si_3N_4$ with a dielectric constant of 7.5 has characteristics of high Young's modulus, high hardness, and high intensity etc., thereby being capable of reducing abrasion of the insulating dielectric layer 6 when the second electrostatic electrode 5 contacts with the insulating dielectric layer 6, and improving life time of the microelectronic switch.

Figure 2:
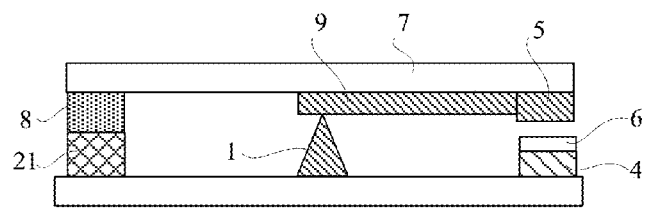
FIG. 2 is a structural schematic view of a microelectronic switch provided by another embodiment of the present invention.

The components such as the gate electrode in the above microelectronic switch may be combined in various manners, for example:

As shown in FIG. 2, according to an embodiment of the present invention, along the extending direction of the cantilever 7, the gate electrode 1 is located between the first electrostatic electrode 4 and the source electrode 21 and drain electrode 22, and the gate electrode 1, the first electrostatic electrode 4, the source electrode 21 and drain electrode 22 are located at the same side of the cantilever 7; when the voltage applied by the gate electrode 1 to the second electrostatic electrode 5 is less than the preset threshold, the cantilever 7 is at the close position, the connecting portion 8 is electrically connected with the source electrode 21 and the drain electrode 22, as shown in FIG. 2; when the voltage applied by the gate electrode 1 to the second electrostatic electrode 5 is greater than the preset threshold value, the first electrostatic electrode 4 and the second electrostatic electrode 5 attract each other, the cantilever 7 is at the open position.

As shown in FIG. 1, according to another embodiment of the present invention, along the extending direction of the cantilever 7, the first electrostatic electrode 4 is located between the gate electrode 1 and the source electrode 21 and drain electrode 22, and the gate electrode 1, the first electrostatic electrode 4, the source electrode 21 and drain electrode 22 are located at the same side of the cantilever 7; when the voltage applied by the gate electrode 1 to the second electrostatic electrode 5 is less than the preset threshold, the cantilever 7 is at the open position; when the voltage applied by the gate electrode 1 to the second electrostatic electrode 5 is greater than the preset threshold value, the first electrostatic electrode 4 and the second electrostatic electrode 5 attract each other, the cantilever 7 is at the close position, the connecting portion 8 is electrically connected with the source electrode 21 and the drain electrode 22.

Of course, the respective components of the micromechanical structure in the above microelectronic switch may also be combined in other manners, which will not be repeated here.

In addition, the present application further provides an active matrix organic light emitting display device, and the active matrix organic light emitting display device comprises a microelectronic switch provided in any of the above embodiments.

Apparently, the skilled person in the art can make various modifications and variants to the respective embodiments according to the present invention without departing from the spirit and scope of the present invention. In this way, provided that these modifications and variants belong to the scopes of the claims of the present invention and the equivalent technologies thereof, the present invention would also intend to cover these modifications and variants.

The invention claimed is:

1. A microelectronic switch, comprising:
   a gate electrode;
   a source electrode;
   a drain electrode;
   a first electrostatic electrode electrically connected with a common electrode line;
   a cantilever with two working positions of an open position and a closed position;
   a connecting portion arranged at a side of the cantilever facing towards the source electrode and the drain electrode wherein the connecting portion is electrically connected with the source electrode and the drain electrode when the cantilever is in the closed position;
   a second electrostatic electrode arranged on a surface of a side of the cantilever facing towards the first electrostatic electrode, the second electrostatic electrode being electrically connected with the gate electrode and arranged opposite to the first electrostatic electrode;
   an insulating dielectric layer arranged between the first electrostatic electrode and the second electrostatic electrode,
   wherein the cantilever is located at one working position of the two working positions when the voltage applied by the gate electrode to the second electrostatic electrode is less than a preset threshold, the first electrostatic electrode and the second electrostatic electrode attract each other so as to enable the cantilever to be switched to the other working position of the two working positions when the voltage applied by the gate electrode to the second electrostatic electrode is greater than the preset threshold.

2. The microelectronic switch according to claim 1, wherein the cantilever is a cantilever made of silicon nitride.

3. The microelectronic switch according to claim 1, wherein the second electrostatic electrode is electrically connected with the gate electrode through a metal beam.

4. The microelectronic switch according to claim 3, wherein the metal beam is made of Au with a Young's modulus of 78 GPa and a Poisson's ratio of 0.44.

5. The microelectronic switch according to claim 3, wherein the second electrostatic electrode has a plurality of through holes extending along a direction in which the second electrostatic electrode faces towards the first electrostatic electrode.

6. The microelectronic switch according to claim 3, wherein the size of the second electrostatic electrode is smaller than the size of the connecting portion along a direction perpendicular to the direction in which the second electrostatic electrode faces towards the first electrostatic electrode and perpendicular to the extending direction of the metal beam.

7. The microelectronic switch according to claim 1, wherein the insulating dielectric layer is arranged on a surface of the first electrostatic electrode facing towards the second electrostatic electrode.

8. The microelectronic switch according to claim 7, wherein the insulating dielectric layer is made of $Si_3N_4$ with a dielectric constant of 7.5.

9. The microelectronic switch according to claim 1, wherein, along the extending direction of the cantilever, the gate electrode is located between the first electrostatic electrode and the source electrode and drain electrode, and the gate electrode, the first electrostatic electrode, the source electrode and drain electrode are located at the same side of the cantilever; when the voltage applied by the gate electrode to the second electrostatic electrode is less than a preset threshold, the cantilever is in the closed position, the connecting portion is electrically connected with the source electrode and the drain electrode; when the voltage applied by the gate electrode to the second electrostatic electrode is greater than the preset threshold, the first electrostatic electrode and the second electrostatic electrode attract each other, the cantilever is in the open position.

10. The microelectronic switch according to claim 1, wherein, along the extending direction of the cantilever, the first electrostatic electrode is located between the gate electrode and the source electrode and drain electrode, and the gate electrode, the first electrostatic electrode, the source electrode and drain electrode are located at the same side of the cantilever; when the voltage applied by the gate electrode to the second electrostatic electrode is less than a preset threshold, the cantilever is in the open position; when the voltage applied by the gate electrode to the second electrostatic electrode is greater than the preset threshold, the first electrostatic electrode and the second electrostatic electrode attract each other, the cantilever is in the closed position, the connecting portion is electrically connected with the source electrode and the drain electrode.

11. An active matrix organic light emitting display device, comprising a microelectronic switch, the microelectronic switch comprising:
   a gate electrode;
   a source electrode;
   a drain electrode;
   a first electrostatic electrode electrically connected with a common electrode line;
   a cantilever with two working positions of an open position and a closed position;
   a connecting portion arranged at a side of the cantilever facing towards the source electrode and the drain electrode wherein the connecting portion is electrically connected with the source electrode and the drain electrode when the cantilever is in the closed position;
   a second electrostatic electrode arranged on a surface of a side of the cantilever facing towards the first electrostatic electrode, the second electrostatic electrode being electrically connected with the gate electrode and arranged opposite to the first electrostatic electrode;
   an insulating dielectric layer arranged between the first electrostatic electrode and the second electrostatic electrode,
   wherein the cantilever is located at one working position of the two working positions when the voltage applied by the gate electrode to the second electrostatic electrode is less than a preset threshold, the first electrostatic electrode and the second electrostatic electrode attract each other so as to enable the cantilever to be switched to the other working position of the two working positions when the voltage applied by the gate electrode to the second electrostatic electrode is greater than the preset threshold.

12. The active matrix organic light emitting display device according to claim 11, wherein the cantilever is a cantilever made of silicon nitride.

13. The active matrix organic light emitting display device according to claim 11, wherein the second electrostatic electrode is electrically connected with the gate electrode through a metal beam.

14. The active matrix organic light emitting display device according to claim 13, wherein the metal beam is made of Au with a Young's modulus of 78 GPa and a Poisson's ratio of 0.44.

15. The active matrix organic light emitting display device according to claim 13, wherein the second electrostatic electrode has a plurality of through holes extending along a direction in which the second electrostatic electrode faces towards the first electrostatic electrode.

16. The active matrix organic light emitting display device according to claim 13, wherein the size of the second electrostatic electrode is smaller than the size of the connecting portion along a direction perpendicular to the direction in which the second electrostatic electrode faces towards the first electrostatic electrode and perpendicular to the extending direction of the metal beam.

17. The active matrix organic light emitting display device according to claim 11, wherein the insulating dielectric layer is arranged on a surface of the first electrostatic electrode facing towards the second electrostatic electrode.

18. The active matrix organic light emitting display device according to claim 17, wherein the insulating dielectric layer is made of $Si_3N_4$ with a dielectric constant of 7.5.

19. The active matrix organic light emitting display device according to claim 11, wherein, along the extending direction of the cantilever, the gate electrode is located between the first electrostatic electrode and the source electrode and drain electrode, and the gate electrode, the first electrostatic electrode, the source electrode and drain electrode are located at the same side of the cantilever; when the voltage applied by the gate electrode to the second electrostatic electrode is less than a preset threshold, the cantilever is in the closed position, the connecting portion is electrically connected with the source electrode and the drain electrode; when the voltage applied by the gate electrode to the second electrostatic electrode is greater than the preset threshold, the first electrostatic electrode and the second electrostatic electrode attract each other, the cantilever is in the open position.

20. The active matrix organic light emitting display device according to claim 11, wherein, along the extending direction of the cantilever, the first electrostatic electrode is located between the gate electrode and the source electrode and drain electrode, and the gate electrode, the first electrostatic electrode, the source electrode and drain electrode are located at the same side of the cantilever; when the voltage applied by the gate electrode to the second electrostatic electrode is less than a preset threshold, the cantilever is in the open position; when the voltage applied by the gate electrode to the second electrostatic electrode is greater than the preset threshold, the first electrostatic electrode and the second electrostatic electrode attract each other, the cantilever is in the closed position, the connecting portion is electrically connected with the source electrode and the drain electrode.

* * * * *